(12) United States Patent
Hiromoto et al.

(10) Patent No.: US 8,604,627 B2
(45) Date of Patent: Dec. 10, 2013

(54) SEMICONDUCTOR DEVICE

(75) Inventors: Hideki Hiromoto, Kyoto (JP); Sadamasa Fujii, Kyoto (JP); Tsunemori Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 626 days.

(21) Appl. No.: 11/918,407

(22) PCT Filed: Apr. 14, 2006

(86) PCT No.: PCT/JP2006/307935
§ 371 (c)(1),
(2), (4) Date: Oct. 12, 2007

(87) PCT Pub. No.: WO2006/112393
PCT Pub. Date: Oct. 26, 2006

(65) Prior Publication Data
US 2010/0001413 A1   Jan. 7, 2010

(30) Foreign Application Priority Data
Apr. 15, 2005 (JP) .................. 2005-118625

(51) Int. Cl.
*H01L 23/49* (2006.01)
(52) U.S. Cl.
USPC ........... 257/784; 257/666; 257/676; 257/678; 257/690; 257/780; 257/781; 257/782; 257/786; 257/E23.023; 257/E23.024; 257/E23.052; 257/E21.499; 257/E21.502; 257/E21.515; 257/E21.518; 257/E21.519
(58) Field of Classification Search
USPC .......... 257/784, 786, E21.518, 666, 676, 678, 257/690, 780–782, E23.052, E23.024, 257/E21.499, E21.502, E21.515, E21.519; 438/106–109, 121, 123–124, 127, 597, 438/612, 617
See application file for complete search history.

(56) References Cited

U.S. PATENT DOCUMENTS

| | | | | |
|---|---|---|---|---|
| 6,265,763 | B1 * | 7/2001 | Jao et al. | 257/676 |
| 6,281,578 | B1 * | 8/2001 | Lo et al. | 257/724 |
| 6,426,563 | B1 * | 7/2002 | Fujihira | 257/780 |
| 6,650,013 | B2 * | 11/2003 | Yin et al. | 257/736 |
| 2001/0035569 | A1 * | 11/2001 | Shibata | 257/667 |
| 2002/0171155 | A1 | 11/2002 | Fujihira | |

FOREIGN PATENT DOCUMENTS

| | | | |
|---|---|---|---|
| JP | 49-122972 | | 11/1974 |
| JP | S49122972 A | * | 11/1974 |
| JP | 57-012530 | | 1/1982 |
| JP | 2001-015541 | | 1/2001 |
| JP | 2001-313363 | | 11/2001 |
| JP | 2002-329740 A | | 11/2002 |
| JP | 2003-309142 | | 10/2003 |

* cited by examiner

*Primary Examiner* — Ermias Woldegeorgis
(74) *Attorney, Agent, or Firm* — Rabin & Berdo, P.C.

(57) ABSTRACT

The present invention aims at providing a semiconductor device capable of reliably preventing a wire bonded to an island from being disconnected due to a thermal shock, a temperature cycle and the like in mounting and capable of preventing remarkable increase in the process time. In the semiconductor device according to the present invention, a semiconductor chip is die-bonded to the surface of an island, one end of a first wire is wire-bonded to an electrode formed on the surface of the semiconductor chip to form a first bonding section and the other end of the first wire is wire-bonded to the island to form a second bonding section, while the semiconductor device is resin-sealed. A double bonding section formed by wire-bonding a second wire is provided on the second bonding section of the first wire wire-bonded onto the island.

59 Claims, 10 Drawing Sheets

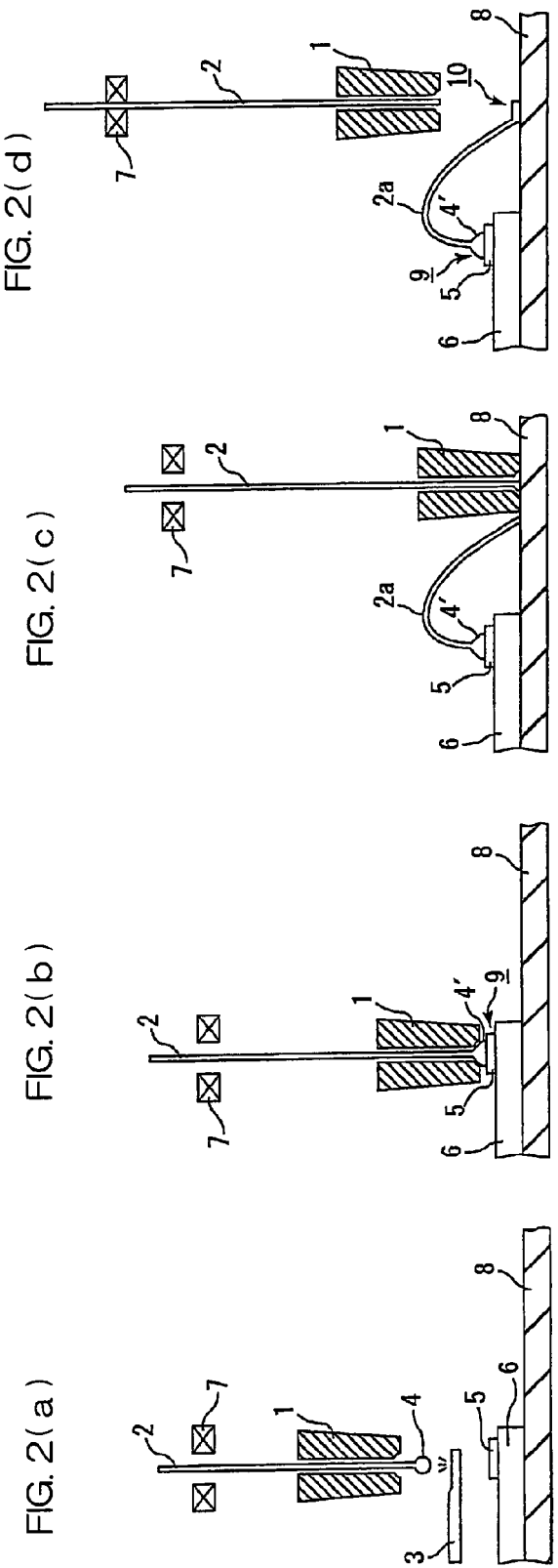

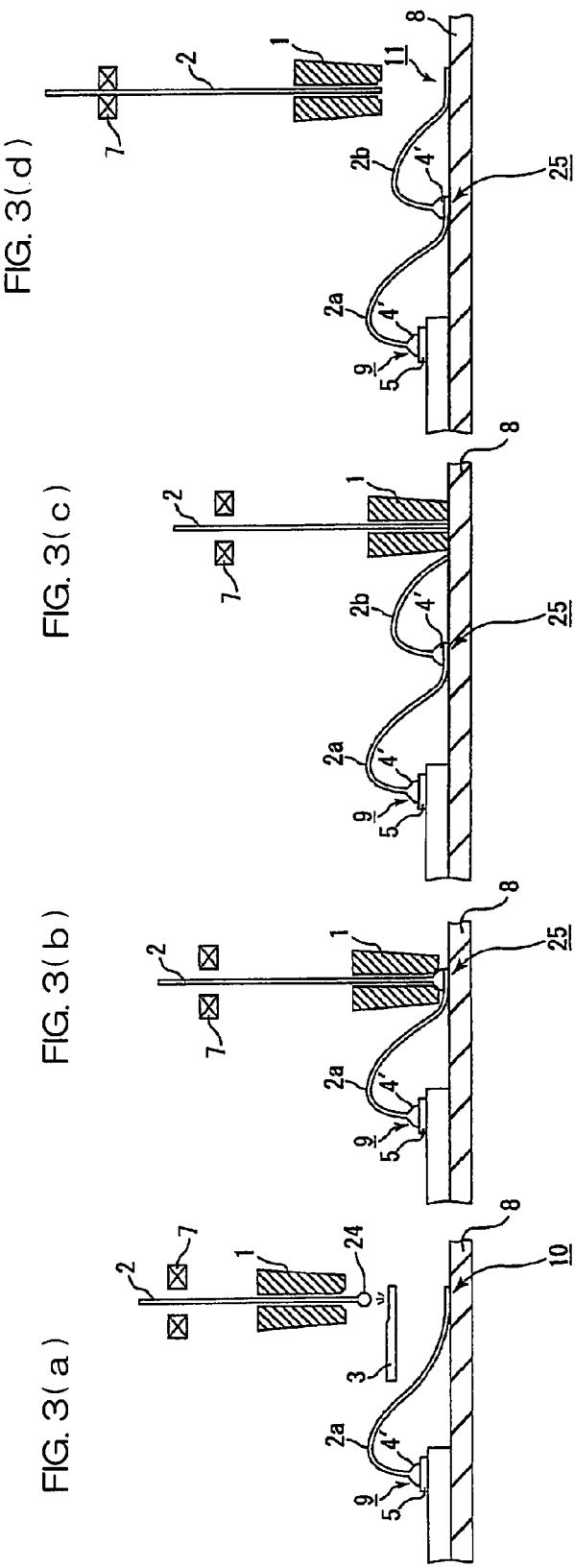

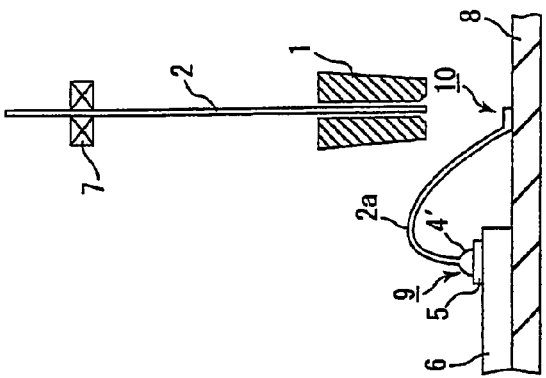
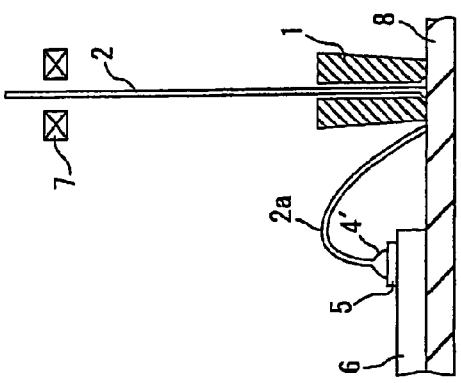
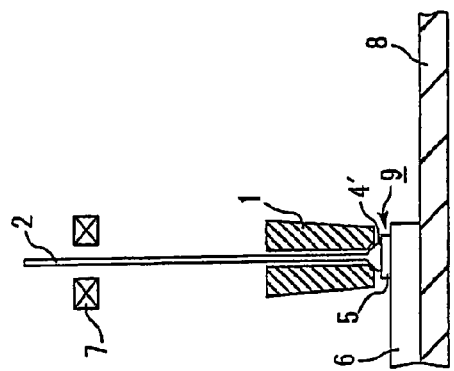
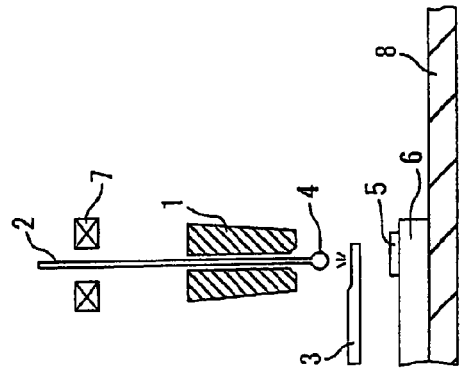

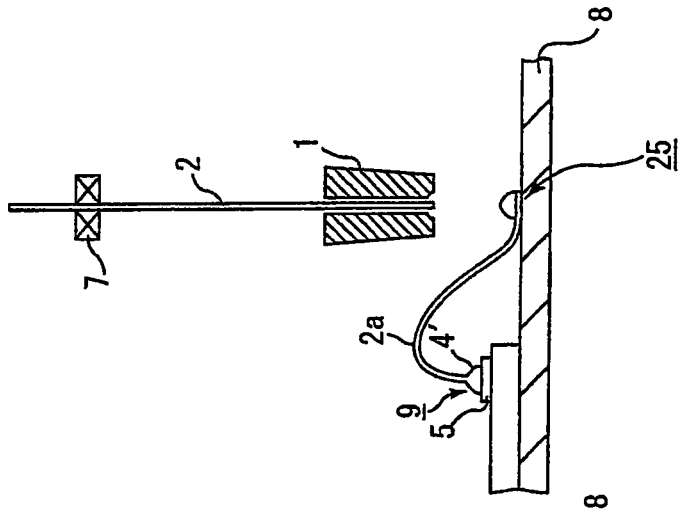
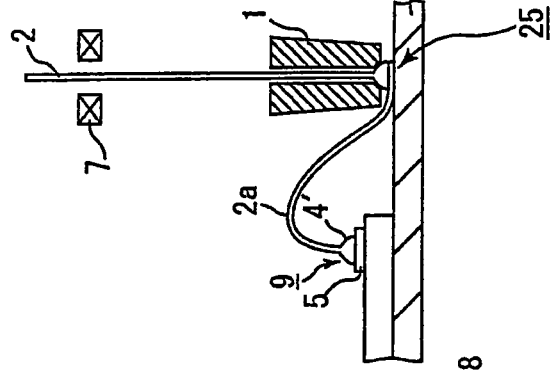
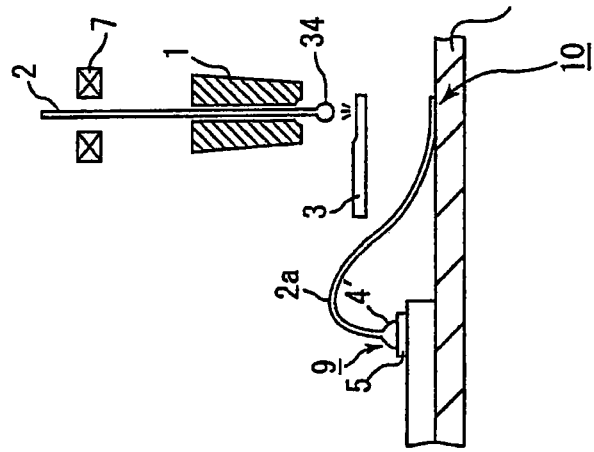

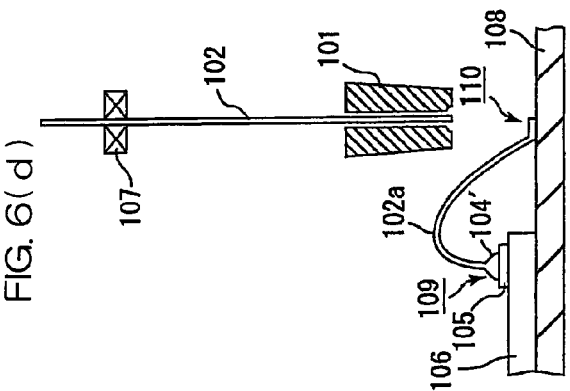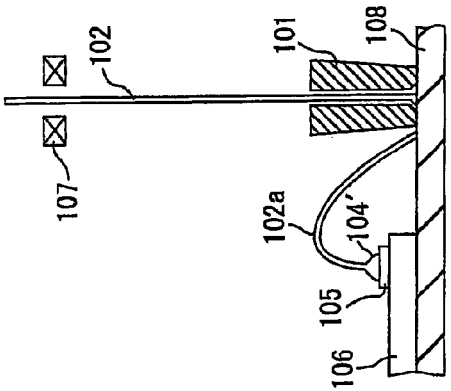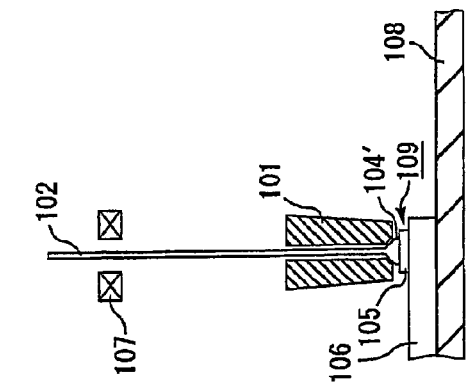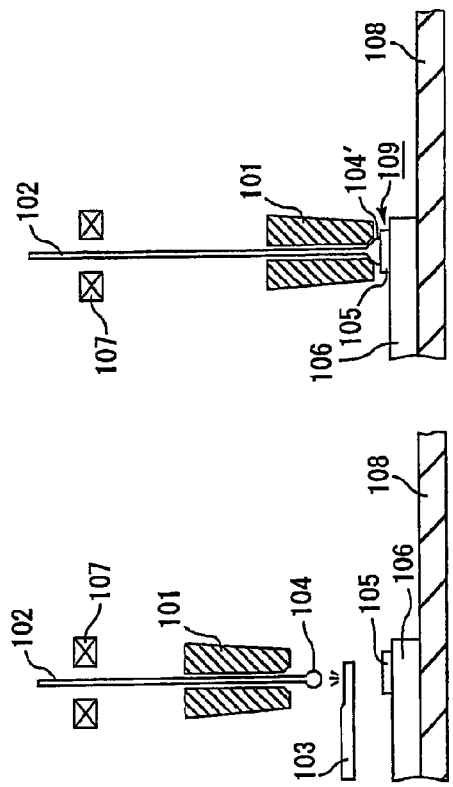

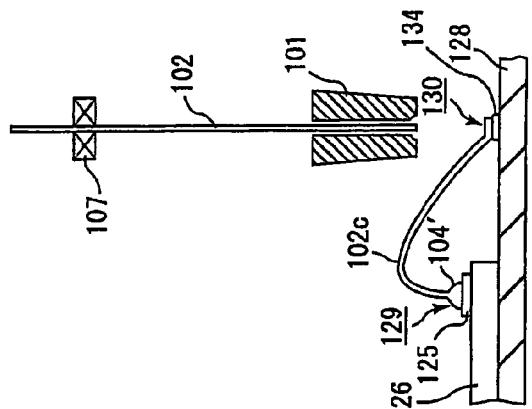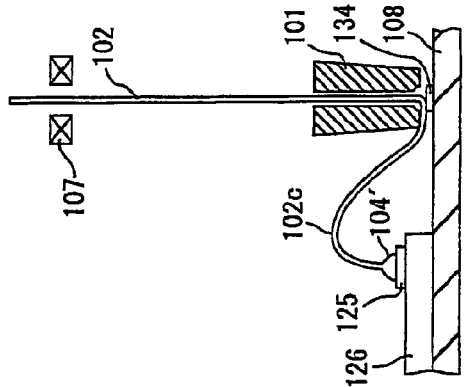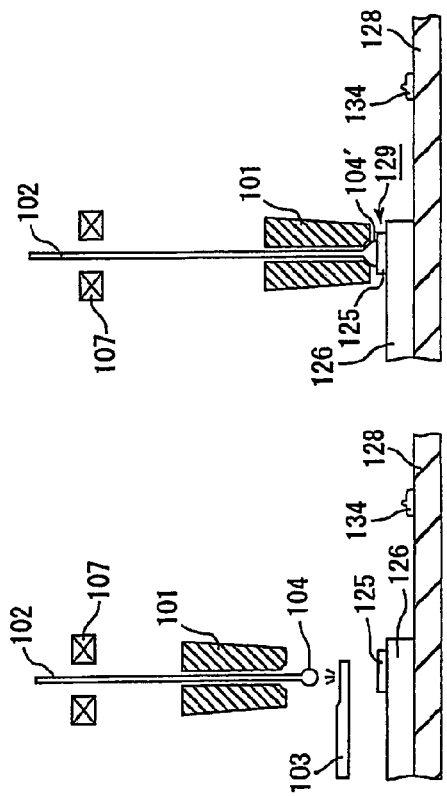

US 8,604,627 B2

SEMICONDUCTOR DEVICE

TECHNICAL FIELD

This application claims priority to Japanese Patent Application No. 2005-118625 filed on Apr. 15, 2005, the disclosure of which is hereby incorporated into the present application.

The present invention relates to a semiconductor device and a method for manufacturing a semiconductor device.

PRIOR ART

There has conventionally been a semiconductor device formed by die-bonding a semiconductor chip to an island and connecting an electrode formed on the upper surface of this semiconductor chip and the island with each other by a wire, among semiconductor devices including a semiconductor chip such as a LSI. Steps related to wire bonding partially forming the steps of manufacturing this semiconductor device are described with reference to FIGS. 6(a) to (d).

FIGS. 6(a) to 6(d) are process drawings schematically showing an example of the sequence of the steps of manufacturing the conventional semiconductor device.

First, as shown in FIG. 6(a), a wire 102 is inserted through a capillary 101, and an electric blowpipe 103 is opposed to the forward end thereof to discharge between the electric blowpipe 103 and the wire 102, thereby heating and melting the forward end of the wire 102 and forming a ball 104.

Then, as shown in FIG. 6(b), the capillary 101 and the wire 102 provided with the ball 104 are moved downward so that the ball 104 comes into contact with an electrode 105 provided on a semiconductor chip 106 and is pressed against and bonded to the electrode 105 by the capillary 101, thereby forming a first bonding section 109 (first bonding). In this step, the semiconductor chip 106 is heated by a heater block (not shown) and the ball 104 is pressed, whereby the ball 104 is thermocompression-bonded to the electrode 105 to form a bonding ball 104'. At this time, ultrasonic waves may be applied simultaneously with the pressing by the capillary 101.

Then, as shown in FIG. 6(c), the capillary 101 moves onto the island 108 along a prescribed locus, and moves downward. At this time, the island 108 is heated by the heater block (not shown) and a portion of a first wire 102a located under the capillary 101 is pressed against the island 108 by the capillary 101, whereby the first wire 102a is thermocompression-bonded onto the island 108.

Then, as shown in FIG. 6(d), a clamper 107 moves upward while keeping clamping the wire 102, whereby the wire 102 is cut, a second bonding section 110 is formed, and the first wire 102a is completely wired.

Thus, the first wire 102a is ball-bonded to the electrode 105 of the semiconductor chip 106 on the first bonding section 109, and stitch-bonded to the island 108 on the second bonding section 110.

FIG. 7 is a longitudinal sectional view schematically showing the semiconductor device manufactured through the aforementioned steps.

As shown in FIG. 7, the semiconductor device 100 includes the semiconductor chip 106 provided with a plurality of the electrodes 105 on the surface thereof, the island 108 having the semiconductor chip 106 bonded to the surface thereof, a plurality of lead terminals 111 arranged at a prescribed interval from the island 108, the first wire 102a electrically connecting the electrode 105 provided on the semiconductor chip 106 with the island 108, another first wire 102b electrically connecting another electrode 105 with the lead terminal 111, and a resin package portion 112 sealing these members.

The first wire 102a is ball-bonded to the electrode 105 provided on the semiconductor chip 106 in the first bonding section 109, and stitch-bonded to the island 108 in the second bonding section 110.

The semiconductor device 100 shown in FIG. 7 is mounted on a printed board or the like by reflow soldering, for example. If the island 108 made of a Cu alloy and the resin package portion 112 made of thermosetting epoxy resin are heated in mounting, for example, these members expand at rates corresponding to the thermal expansion coefficients specific thereto respectively, whereby relative slippage may take place on the interface between the island 108 and the resin package portion 112 due to the difference between the thermal expansion coefficients of the island 108 and the resin package portion 112, to disconnect the first wire 102a.

Particularly in the second bonding section 110, the first wire 102a and the island 108 are connected to each other by stitch bonding, the thickness and the bonding strength thereof are small, whereby the second bonding section 110 may be cracked or separated from the island 108, thereby to cause disconnection in many cases.

In order to solve such a problem, there has conventionally been proposed a semiconductor device having a structure obtained by bonding a wire onto a bump formed on an island by stitch bonding, for example (refer to Patent Document 1, for example). Steps related to wire bonding partially forming the steps of manufacturing this semiconductor device are now described with reference to FIGS. 8(a) to 8(c) and 9(a) to 9(d).

FIGS. 8(a) to 8(c) and 9(a) to 9(d) are process drawings schematically showing another example of the sequence of the steps of manufacturing the conventional semiconductor device.

FIGS. 8(a) to 8(c) are process drawings schematically showing the steps of forming the bump on the island, and FIGS. 9(a) to 9(d) are process drawings schematically showing the steps of wire-bonding a first wire.

First, a wire 102 is inserted through a capillary 101 as shown in FIG. 8(a), and an electric blowpipe 103 is opposed to the forward end thereof to discharge between the electric blowpipe 103 and the wire 102, thereby heating and melting the forward end of the wire 102 and forming a ball 104.

Then, as shown in FIG. 8(b), the capillary 101 is moved downward, thereby pressing and bonding the ball 104 against and to an island 128 by the capillary 101. In this step, the island 128 is heated by a heater block (not shown) and the ball 104 is pressed against the island 128, whereby the ball 104 is thermocompression-bonded to the island 128 to form a bonding ball 104'. At this time, ultrasonic waves may be applied simultaneously with the pressing by the capillary 101.

Then, as shown in FIG. 8(c), a clamper 107 moves upward while keeping clamping the wire 102. Thus, the metal wire 102 is cut along the joint with the bonding ball 104', whereby a bump 134 is formed on the island 128.

Then, as shown in FIG. 9(a), the wire 102 is inserted through a capillary 101, and an electric blowpipe 103 is opposed to the forward end thereof to discharge between the an electric blowpipe 103 and the wire 102, thereby heating and melting the forward end of the wire 102 and forming a ball 104.

Then, as shown in FIG. 9(b), the capillary 101 is moved downward to press and bond the ball 104 against and to an electrode 125 provided on a semiconductor chip 126 by the capillary 101, thereby forming a first bonding section 129. In this step, the semiconductor chip 126 is heated by a heater block (not shown) and the ball 104 is pressed against the electrode 125, whereby the ball 104 is thermocompression-bonded to the electrode 125 to form a bonding ball 104'. At this time, ultrasonic waves may be applied simultaneously with the pressing by the capillary 101.

Then, as shown in FIG. 9(c), the capillary 101 moves along a prescribed locus onto an island 108 provided with a bump 134 thereon, and moves downward. At this time, the island 108 is heated by the heater block (not shown) and a portion of a first wire 102c located under the capillary 101 is pressed against the bump 134 provided on the island 108 by the capillary 101, whereby the first wire 102c is thermocompression-bonded to the bump 134 provided on the island 108.

Then, as shown in FIG. 9(d), a clamper 107 moves upward while keeping clamping the wire 102, whereby the wire 102 is cut, a second bonding section 130 is formed, and the first wire 102c is completely wired.

According to the aforementioned method, the first wire 102c is ball-bonded onto the electrode 125 of the semiconductor chip 126 in the first bonding section 129, and stitch-bonded to the bump 134 provided on the island 128 in the second bonding section 130.

FIG. 10 is a longitudinal sectional view of the semiconductor device manufactured through the aforementioned manufacturing steps.

As shown in FIG. 10, the semiconductor device 120 includes the semiconductor chip 126 having a plurality of the electrodes 125 formed on the surface thereof, the island 128 having the semiconductor chip 126 bonded to the surface thereof, a plurality of lead terminals 131 arranged at a prescribed interval from the island 108, the first wire 102c electrically connecting the electrode 125 provided on the semiconductor chip 126 with the island 128, another first wire 102d electrically connecting another electrode 125 with the lead terminal 131, and a resin package portion 132 sealing these members.

The first wire 102c is ball-bonded to the electrode 126 of the semiconductor chip 126 in the first bonding section 129, and stitch-bonded to the bump 134 provided on the island 128 in the second bonding section 130.

According to the semiconductor device 120 shown in FIG. 10, the first wire 102c is stitch-bonded to the bump 134 having the same metal composition as the first wire 102c on the second bonding section 130, whereby the thickness of the junction can be increased by the thickness of the bump 134. Therefore, the bonding strength on the second bonding section 130 is increased, and disconnection of the first wire 102c is hardly caused.

Patent Document 1: Japanese Unexamined Patent Publication No. 2003-309142

DISCLOSURE OF THE INVENTION

Problems to be Solved by the Invention

In the semiconductor device according to Patent Document 1, however, the capillary of the wire bonding apparatus must move from the position located above the bump thus formed to the position located above the electrode of the semiconductor chip once after forming the bump for performing the first bonding and thereafter return to the position located above the bump again for performing the second bonding, whereby the capillary is easily displaced, and there has been a possibility for such a problem that the yield is deteriorated. Further, there has also been such a problem that the process time is increased due to the formation of the bump through a different step.

The present invention is proposed in consideration of the aforementioned problems, and an object thereof is to provide a semiconductor device and a method for manufacturing the semiconductor device capable of reliably preventing a wire wire-bonded to an island from being disconnected due to a thermal shock, a temperature cycle and the like in mounting, for example, and capable of preventing remarkable increase in the process time.

Solutions to the Problems

In order to solve the aforementioned problems, the present invention provides:

(1) A semiconductor device, sealed with resin, in which a semiconductor chip is die-bonded to the surface of an island, one end of a first wire is wire-bonded to an electrode formed on the surface of the semiconductor chip to form a first bonding section, and the other end of the first wire is wire-bonded to the island to form a second bonding section, wherein
a double bonding section formed by wire-bonding a second wire is provided on the second bonding section of the first wire wire-bonded onto the island.

According to the invention in (1), the double bonding section to which the one end of the second wire is wire-bonded is formed on the second bonding section of the first wire bonded to the island, whereby the double bonding section serving as the junction between the first wire and the island has a large thickness. Therefore, the bonding strength of the double bonding section to the island is increased, and disconnection of the first wire can be hardly caused.

According to the invention in (1), further, the semiconductor device can be manufactured by a manufacturing method carrying out a step of bonding the one end of the second wire onto the bonding section of the first wire bonded onto the island subsequently to a second bonding step of wire-bonding the first wire to the island, whereby a capillary of a wire bonding device can form the double bonding section on the bonding section as a serial step from the second bonding step without moving in the X-Y direction after forming the second bonding section by wire-bonding the first wire to the island. When the aforementioned manufacturing method is employed, therefore, displacement resulting from movement of the capillary in the X-Y direction is hardly caused, and the double bonding section can be reliably formed on the second bonding section.

Further, the capillary does not move in the X-Y direction between the second bonding step and the double bonding step but these steps are carried out as a series of steps, whereby increase in the process time can be prevented.

The present invention also provides:

(2) The semiconductor device according to above (1), wherein
the double bonding section is formed by ball bonding.

According to the invention in (2), the double bonding section is formed by ball bonding, thereby to have high bonding strength with the island. Therefore, the double bonding section is strongly bonded to the island, whereby disconnection of the wire can be more reliably prevented.

The present invention further provides:

(3) A method for manufacturing a semiconductor device, connecting an electrode provided on a semiconductor chip die-bonded to an island and the island with each other by wire bonding, including:
a first bonding step of forming a first bonding section by wire-bonding one end of a first wire to the electrode;
a second bonding step of forming a second bonding section by wire-bonding the other end of the first wire to the island; and a double bonding step of forming a double bonding section by bonding one end of a second wire onto the second bonding section of the first wire bonded to the island.

According to the invention in (3), the double bonding section is formed by wire-bonding the one end of the second wire through the double bonding step onto the second bonding section of the first wire bonded to the island through the second bonding step, whereby the thickness of the double bonding section serving as the junction between the first wire and the island can be increased. Therefore, the bonding strength of the double bonding section with the island is increased, and disconnection of the first wire can be hardly caused.

Further, the double bonding section can be precisely formed by further performing wire bonding on the second bonding section, by simply moving the capillary for forming wire bonding upward directly and downward again after termination of the second bonding step of forming the second bonding section, for example.

In other words, the double bonding step of forming the double bonding section is continuously carried out subsequently to the second bonding step of forming the second bonding section by wire-bonding the first wire to the island, whereby the capillary of the wire bonding device can form the double bonding section on the second bonding section as a serial step from the second bonding step without moving in the X-Y direction after forming the second bonding section by wire-bonding the first wire to the island. Therefore, displacement resulting from movement in the X-Y direction is hardly caused, and the double bonding section can be reliably formed on the second bonding section.

Further, the capillary does not move in the X-Y direction between the second bonding step and the double bonding step but these steps are carried out as a series of steps, whereby increase in the process time can be prevented.

The present invention further provides:

(4) The method for manufacturing a semiconductor device according to above (3), wherein the double bonding section is formed by ball bonding in the double bonding step.

According to the invention in (4), the double bonding section is formed by ball bonding with high bonding strength, whereby a stronger double bonding section can be formed. Therefore, disconnection of the wire can be more reliably prevented.

Effect of the Invention

According to the present invention, a method for manufacturing a semiconductor device capable of more reliably preventing a wire wire-bonded to an island from being disconnected due to a thermal shock, a temperature cycle and the like in mounting, for example, as compared with a case of employing a structure without double bonding and capable of preventing remarkable increase in the process time, and a semiconductor device capable of preventing disconnection of a first wire can be provided.

BEST MODE FOR CARRYING OUT THE INVENTION

First Embodiment

FIG. 1 is a sectional view schematically showing an example of a semiconductor device according to a first embodiment of the present invention.

As shown in FIG. 1, the semiconductor device 30 includes a semiconductor chip 6 having a plurality of electrodes 5 formed on the surface thereof, an island 8 having the semiconductor chip 6 bonded to the surface thereof, a plurality of lead terminals 13 arranged at a prescribed interval from the island 8, a first wire 2a electrically connecting the electrode 5 provided on the semiconductor chip 6 with the island 8, a double bonding section 25 formed by performing ball bonding onto a second bonding section 10 (not shown), a second wire 2b having one end provided on the double bonding section 25, another first wire 2c electrically connecting another electrode 5 with the lead terminal 13 and a resin package portion 12 sealing these members.

In the semiconductor device 30, the double bonding section 25 to which the one end of the second wire 2b is wire-bonded is formed on the second bonding section 10 of the first wire 2a bonded to the island 8, whereby the double bonding section 25 serving as the junction between the first wire 2a and the island 8 has a large thickness. Therefore, the bonding strength of the double bonding section 25 to the island 8 is increased, and disconnection of the first wire 2a can be hardly caused.

The semiconductor device 30 can be manufactured through manufacturing process including a second bonding step of wire-bonding the first wire 2a to the island 8 and a subsequent double bonding step of forming the double bonding section 25 by bonding the one end of the second wire 2b to the second bonding section 10 (not shown) of the first wire 2a bonded to the island 8, whereby a capillary 1 of a wire bonding device can form the double bonding section 25 on the second bonding section 10 without moving in the X-Y direction after forming the second bonding section 10 by bonding the first wire 2a to the island 8. When the aforementioned method is employed, therefore, displacement resulting from movement in the X-Y direction is hardly caused, and the double bonding section 25 can be reliably formed on the second bonding section 10.

In the semiconductor device 30, the double bonding section 25 is formed by ball bonding, thereby to have high bonding strength with the island 8. Therefore, the double bonding section 25 is strongly bonded to the island 8, whereby disconnection of the first wire 2a can be more reliably prevented.

FIGS. 2(a) to 2(d) and 3(a) to 3(d) are process drawings schematically showing steps related to wire bonding partially forming the manufacturing process the aforementioned semiconductor device.

First, as shown in FIG. 2(a), a wire 2 is inserted through the capillary 1 and an electric blowpipe 3 is opposed to the forward end thereof to discharge between the electric blowpipe 3 and the wire 2, thereby heating and melting the forward end of the wire 2 to form a ball 4.

Then, as shown in FIG. 2(b), the capillary 1 and the wire 2 provided with the ball 4 are moved downward, to bring the ball 4 into contact with the electrode 5 provided on the semiconductor chip 6 and press and bond the ball 4 against and to the electrode 5 by the capillary 1, thereby forming the first bonding section 9. In this step, the semiconductor chip 6 is heated by a heater block (not shown) and the ball 4 is pressed, whereby the ball 4 is thermocompression-bonded to the electrode 5 to form a bonding ball 4'. At this time, ultrasonic waves may be applied simultaneously with the pressing by the capillary 1. The step shown in FIG. 2(b) corresponds to the first bonding step in the present invention.

Then, as shown in FIG. 2(c), the capillary 1 moves onto the island 8 along a prescribed locus, and moves downward. At this time, the island 8 is heated by the heater block (not shown) and a portion of the first wire 2a located under the capillary 1 is pressed against the island 8 by the capillary 1, whereby the first wire 2a is thermocompression-bonded onto the island 8.

Then, as shown in FIG. 2(d), a clamper 7 moves upward while keeping clamping the wire 2, whereby the wire 2 is cut, the second bonding section 10 is formed, and the first wire 2a is completely wired. The steps shown in FIGS. 2(c) and 2(d) correspond to the second bonding step in the present invention.

Thus, the first wire 2a is ball-bonded to the electrode 5 of the semiconductor chip 6 in the first bonding section 9, and stitch-bonded to the island 8 in the second bonding section 10.

Then, as shown in FIG. 3(a), the electric blowpipe 3 is opposed to the forward end of the wire 2 inserted through the capillary 1 to discharge between the electric blowpipe 3 and the wire 2, thereby heating and melting the forward end of the wire 2 to form a ball 24.

Then, as shown in FIG. 3(b), the capillary 1 and the wire 2 provided with the ball 24 are moved downward to bring the ball 24 into contact with the second bonding section 10 provided on the island 8 and press and bond the ball 24 against and to the second bonding section 10 by the capillary 1, thereby forming the double bonding section 25. In this step, the semiconductor chip 6 is heated by the heater block (not shown) and the ball 24 is pressed against the second bonding section 10, whereby the ball 24 is thermocompression-bonded to the second bonding section 10 to form the double bonding section 25. At this time, ultrasonic waves may be applied simultaneously with the pressing by the capillary 1. The step shown in FIG. 3(b) corresponds to the double bonding step in the present invention.

This double bonding step is carried out as a serial step subsequently to the second bonding step without moving the capillary of the wire bonding device in the X-Y direction.

Thus, the double bonding section 25 having a large thickness and high bonding strength can be formed by ball-bonding the second wire 2b onto the second bonding section 10 which is stitch-bonded to the island 8 and has a small thickness and low bonding strength.

In the present invention, the term "double bonding section" denotes a junction integrally bonded to the island by further performing wire bonding on the second bonding section of the first wire bonded onto the island.

Then, as shown in FIG. 3(c), the capillary 1 moves along a prescribed locus to another position (rightward of the double bonding section 25 in the figure) of the island 8 different from that of the double bonding section 25, and moves downward. At this time, the island 8 is heated by the heater block (not shown) and the axial side surface of the second wire 2b is pressed against the island 8, whereby the second wire 2b is thermocompression-bonded onto the island 8.

Then, as shown in FIG. 3(d), the clamper 7 moves upward while keeping clamping the wire 2, whereby the wire 2 is cut, a second wire second bonding section 11 is formed, and the second wire 2b is completely wired.

In the method for manufacturing the semiconductor device according the first embodiment, the double bonding section 25 is formed by wire-bonding the one end of the second wire 2b through the double bonding step onto the second bonding section 10 of the first wire 2a bonded to the island 8 through the second bonding step, whereby the thickness of the double bonding section 25 serving as the junction between the first wire 2a and the island 8 can be increased. Therefore, the bonding strength of the double bonding section 25 to the island 8 is increased, and disconnection of the first wire 2a can be hardly caused.

Further, the double bonding section 25 can be precisely formed by further performing wire bonding on the second bonding section 10 by simply moving the capillary 1 for forming wire bonding upward directly and downward again after termination of the second bonding step of forming the second bonding section 10.

In other words, the double bonding step of forming the double bonding section 25 is continuously carried out subsequently to the second bonding step of forming the second bonding section 10 by wire-bonding to the island 8, whereby the capillary 1 of the wire bonding device can form the double bonding section 25 on the second bonding section 10 as a serial step from the second bonding step without moving in the X-Y direction after forming the second bonding section 10 by wire-bonding the first wire 2a to the island 8. Therefore, displacement resulting from movement in the X-Y direction is hardly caused, and the double bonding section 25 can be reliably formed on the second bonding section 10.

Further, the capillary 1 does not move in the X-Y direction between the second bonding step and the double bonding step but these steps are carried out as a series of steps, whereby increase in the process time can be prevented.

In addition, the double bonding section 25 is formed by ball bonding with high bonding strength, whereby a stronger double bonding section 25 can be formed. Therefore, disconnection of the first wire 2a can be more reliably prevented.

While the case of forming the second wire second bonding section has been described with reference to the first embodiment, the second wire second bonding section may not be formed in the present invention.

Second Embodiment

A semiconductor device according to a second embodiment has a structure generally similar to that of the semiconductor device according to the first embodiment except that no second wire is present and no second wire second bonding section is formed. Therefore, the description about the structure is omitted, and steps related to wire bonding are now described. Elements corresponding to those of the semiconductor device according to the first embodiment are denoted by the same reference numerals.

FIGS. 4(a) to 4(d) and 5(a) to 5(c) are process drawings schematically showing the steps related to wire bonding partially forming the steps of manufacturing the semiconductor device according to the second embodiment of the present invention. First, a wire 2 is inserted through a capillary 1 as shown in FIG. 4(a), and an electric blowpipe 3 is opposed to the forward end thereof to discharge between the electric blowpipe 3 and the wire 2, thereby heating and melting the forward end of the wire 2 to form a ball 4.

Then, as shown in FIG. 4(b), the capillary 1 and the wire 2 provided with the ball 4 are moved downward to bring the ball 4 into contact with an electrode 5 provided on a semiconductor chip 6 and press and bond the ball 4 against and to the electrode 5 by the capillary 1, thereby forming a first bonding section 9. In this step, the semiconductor chip 6 is heated by a heater block (not shown) and the ball 4 is pressed, whereby the ball 4 is thermocompression-bonded to the electrode 5 to form a bonding ball 4'. At this time, ultrasonic waves may be applied simultaneously with the pressing by the capillary 1. The step shown in FIG. 4(b) corresponds to the first bonding step in the present invention.

Then, as shown in FIG. 4(c), the capillary 1 moves onto the island 8 along a prescribed locus, and moves downward. At this time, the island 8 is heated by the heater block (not shown) and a portion of a first wire 2a located under the capillary 1 is pressed against the island 8 by the capillary 1, whereby the first wire 2a is thermocompression-bonded onto the island 8.

Then, as shown in FIG. 4(d), a clamper 7 moves upward while keeping clamping the wire 2, whereby the wire 2 is cut, a second bonding section 10 is formed, and the first wire 2a is completely wired. The steps shown in FIGS. 4(c) and 4(d) correspond to the second bonding step in the present invention.

Thus, the first wire 2a is ball-bonded to the electrode 5 of the semiconductor chip 6 in the first bonding section 9, and stitch-bonded to the island 8 in the second bonding section 10.

Then, as shown in FIG. 5(a), the electric blowpipe 3 is opposed to the forward end of the wire 2 inserted through the capillary 1 to discharge between the electric blowpipe 3 and the wire 2, thereby heating and melting the forward end of the wire 2 to form a ball 34.

Then, as shown in FIG. 5(b), the capillary 1 and the wire 2 provided with the ball 34 are moved downward to bring the ball 34 into contact with the second bonding section 10 provided on the island 8 and press and bond the ball 34 against and to the second bonding section 10 by the capillary 1, thereby forming a double bonding section 25. In this step, the semiconductor chip 6 is heated by the heater block (not shown) and the ball 34 is pressed against the second bonding section 10, whereby the ball 34 is thermocompression-bonded to the second bonding section 10 to form a double bonding section 25. At this time, ultrasonic waves may be applied simultaneously with the pressing by the capillary 1. The step shown in FIG. 5(b) corresponds to the double bonding step in the present invention.

This double bonding step is carried out as a serial step subsequently to the second bonding step without moving the capillary of a wire bonding device in the X-Y direction.

Thus, the double bonding section 25 having a large thickness and high bonding strength can be formed by ball-bonding the second wire 2b onto the second bonding section 10 which is stitch-bonded to the island 8 and has a small thickness and low bonding strength. These steps are similar to the manufacturing steps according to the first embodiment.

Then, as shown in FIG. 5(c), the clamper 7 moves upward while keeping clamping the wire 2. Thus, the metal wire 2 is cut along the joint with the double bonding section 25.

Thus, according to the present invention, it is also possible to form no second wire second bonding section by moving the clamper 7 of the wire bonding device upward in the state of keeping clamping the wire 2 and cutting the wire 2 after forming the double bonding section 25. When the manufacturing process according to the second embodiment is employed, the double bonding section may be pulled upward depending on the conditions, to result in a possibility of reducing the bonding strength. Therefore, the wire is preferably cut under conditions of minimizing the force pulling the double bonding section upward.

While the position of the double bonding section formed on the island is not particularly limited in the present invention, this position is preferably close to the semiconductor chip in the range where the capillary of the wire bonding device is reachable without coming into contact with the semiconductor chip. The difference between the respective quantities of deformation caused in the island and the resin package portion resulting from thermal expansion is reduced as the region of the island approaches the semiconductor chip, so that relative slippage on the interface therebetween is reduced thereby to hardly cause disconnection of the first wire.

In the present invention, the double bonding section formed on the second bonding section may be at least partially formed on the second bonding section. When the double bonding section is partially formed on the second bonding section, the bonding strength of the first wire to the island can be increased.

Further, the double bonding section may be formed not on the second bonding section but partially on the first wire (on a portion of the first wire in the vicinity of the second bonding section, for example). When the double bonding section is partially formed on the first wire, the first wire can be strongly bonded to the island, and the bonding strength of the first wire to the island can be increased.

While the area of the double bonding section bonded to the island is generally identical to that of the first bonding section, i.e., the size of the ball in the present invention, the area of the double bonding section formed by ball bonding may alternatively be widened by employing a large-diameter wire to increase the size of the ball, for example. When the double bonding section is bonded to the island over a wide area, the bonding strength can be increased.

While the position of the second wire second bonding section is not particularly limited in the present invention, the position is preferably in the vicinity of the double bonding section. When the second wire second bonding section is in the vicinity of the double bonding section, the distance of movement of the capillary of the wire bonding device can be reduced, and the process time is not increased. Further, the cost can be reduced as the length of the second wire is reduced.

While the bent shape of the second wire is not particularly limited in the present invention, a bent shape generally horizontally extending with respect to the plane of the island is preferable. In particular, the top of the second wire is preferably lower than the top of the bent shape of the first wire. The thickness of the resin package portion provided on the upper surface of the semiconductor device can be reduced as the top of the second wire is lowered, so that a thin molded package can be obtained.

While the method for manufacturing a semiconductor device electrically connecting a semiconductor chip and an island has been described with reference to each of the embodiments, the method for manufacturing a semiconductor device according to the present invention is not limited to this example but is also employable in a case of connecting a semiconductor chip and a lead terminal with each other or a case of connecting another element (optical element, for example) bonded onto an island with the island or a lead terminal, for example.

The resin employed for forming the resin package portion is not particularly limited but can be prepared from a resin composition containing thermosetting epoxy resin serving as a main resin component, phenol resin serving as a curing component and an inorganic filler, for example. Further, heat-resistant thermoplastic resin such as PPS (polyphenylene sulfide) resin or PPE (polyphenylene ether) resin can also be employed as the aforementioned main resin component, in place of the epoxy resin. The aforementioned inorganic filler is not particularly limited, but can be prepared from quartz glass, crystalline silica, molten silica or the like.

The wire employed in the present invention is not particularly limited, but can be made of gold (Au), aluminum (Al), copper (Cu), platinum (Pt), palladium (Pd), silver (Ag), a gold alloy, an aluminum alloy, a copper alloy, a platinum alloy, a palladium alloy or a silver alloy.

While the embodiments of the semiconductor device and the semiconductor device manufacturing method according

BRIEF DESCRIPTION OF THE DRAWINGS

FIGS. 2(a) to 2(d) are process views schematically showing an example of the sequence of the steps of manufacturing the semiconductor device according to the first embodiment.

FIGS. 3(a) to 3(d) are process views schematically showing an example of the sequence of the steps of manufacturing the semiconductor device according to the first embodiment.

FIGS. 4(a) to 4(d) are process views schematically showing an example of the sequence of the steps of manufacturing a semiconductor device according to a second embodiment.

FIGS. 5(a) to 5(c) are process views schematically showing an example of the sequence of the steps of manufacturing a semiconductor device according to the second embodiment.

FIGS. 6(a) to 6(d) are process views schematically showing an example of the sequence of the steps of manufacturing a conventional semiconductor device.

FIGS. 8(a) to 8(d) are process views schematically showing another example of the sequence of the steps of manufacturing a conventional semiconductor device.

FIGS. 9(a) to 9(d) are process views schematically showing another example of the sequence of the steps of manufacturing a conventional semiconductor device.

Figure 1:
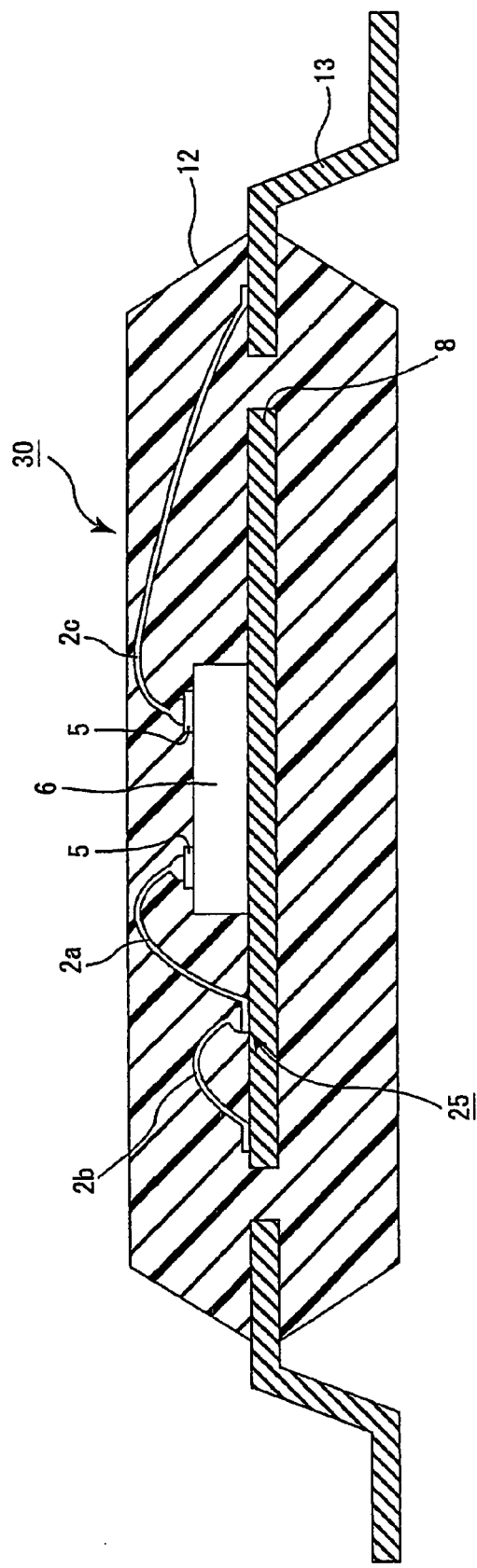
FIG. 1 is a longitudinal sectional view schematically showing an example of a semiconductor device according to a first embodiment.
Figure 7:
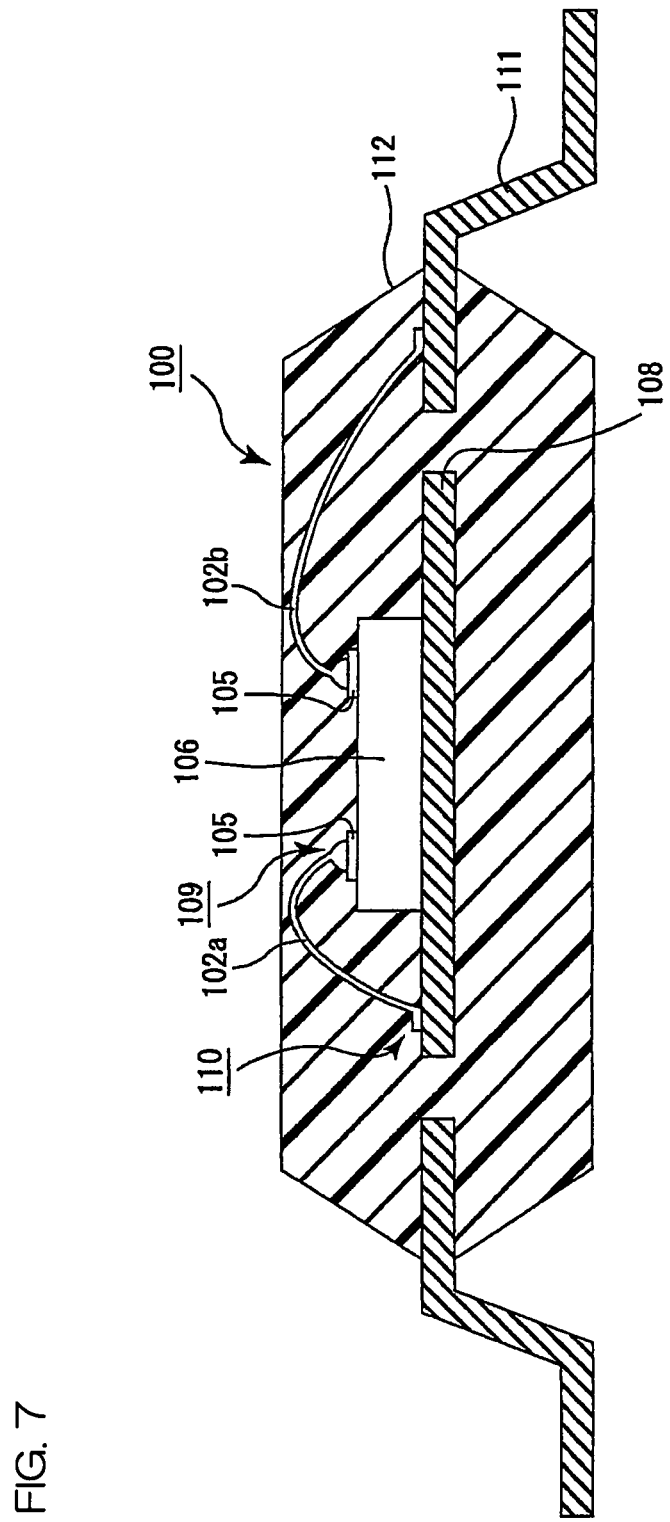
FIG. 7 is a longitudinal sectional view schematically showing the semiconductor device manufactured through the manufacturing process shown in FIG. 6.
Figure 8A:
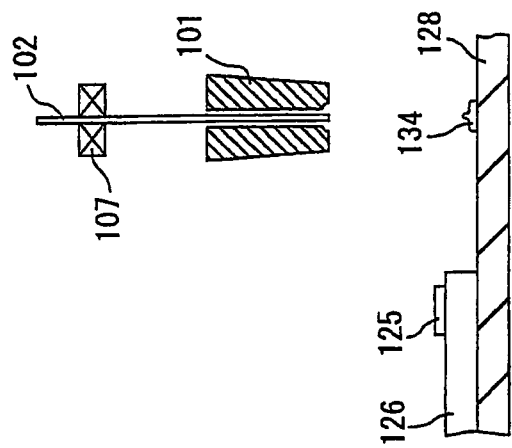
Figure 8B:
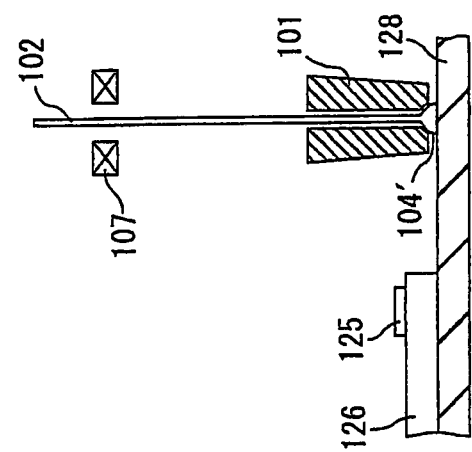
Figure 8C:
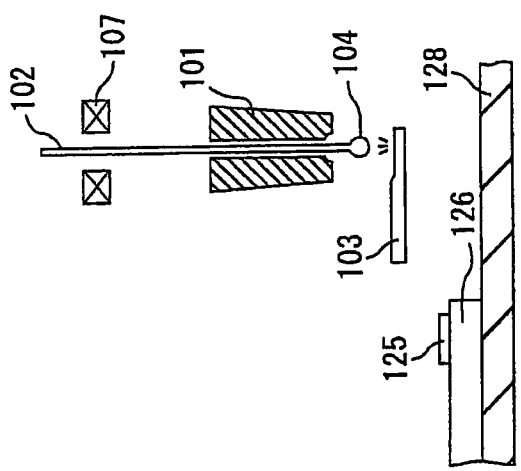
Figure 10:
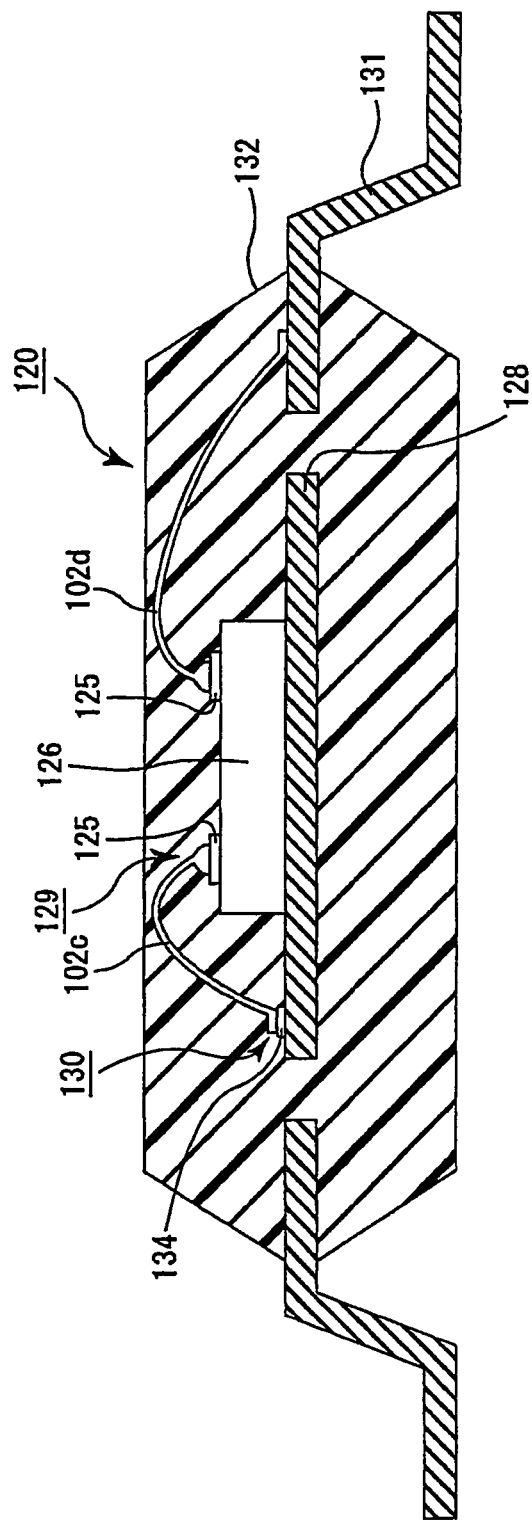
FIG. 10 is a longitudinal sectional view schematically showing the semiconductor device manufactured through the manufacturing process shown in FIGS. 8 and 9.

DESCRIPTION OF THE REFERENCE NUMERALS 1 capillary
2 wire
2a first wire
2b second wire
2c first wire
3 electric blowpipe
4, 24 ball
4' bonding ball
5 electrode
6 semiconductor chip
7 clamp
8 island
9 first bonding section
10 second bonding section
11 second wire second bonding section
12 resin package portion
13 lead terminal
25 double bonding section
30 semiconductor device

The invention claimed is:

1. A semiconductor device, sealed with resin, in which a semiconductor chip is die-bonded to a surface of an island, a first end of a first wire is wire-bonded to an electrode formed on a surface of the semiconductor chip to form a first bonding section, and a second end of the first wire is wire-bonded directly to the island to form a second bonding section, wherein the island is made of an electrical conductor,
the semiconductor chip and the island are sealed with the resin,
a double bonding section formed by wire-bonding a second wire is provided on the second bonding section of the first wire wire-bonded onto the island,
the second bonding section having an extended portion formed by the second end of the first wire pressed directly on the island,
a first end of the second wire being connected onto the second bonding section, a second end of the second wire being connected to the surface of the island, the first end of the second wire being in direct contact with the first wire on the extended portion to form the double bonding section,
further comprising a lead terminal electrically connected with the semiconductor chip,
wherein the second end of the first wire and the second end of the second wire are directly attached to the island, the first end of the first wire and the first end of the second wire are indirectly attached to the island, and a difference in height between the first end of the first wire and the first end of the second wire is the same as a thickness of the semiconductor chip,
wherein the lead terminal and the semiconductor chip are connected by a third wire, the lead terminal is provided separately from the island and the third wire is provided separately from the first wire.

2. The semiconductor device according to claim 1, wherein the resin contains a main resin component and a curing component.

3. The semiconductor device according to claim 2, wherein the main resin component contains thermoplastic resin.

4. The semiconductor device according to claim 2, wherein the main resin component contains thermosetting resin.

5. The semiconductor device according to claim 2, wherein the main resin component contains at least one of epoxy resin, polyphenylene sulfide resin and polyphenylene ether resin.

6. The semiconductor device according to claim 2, wherein the curing component contains phenol resin, and the resin further contains an inorganic filler.

7. The semiconductor device according to claim 6, wherein the inorganic filler contains at least one of quartz glass, crystalline silica and molten silica.

8. The semiconductor device according to claim 1, wherein the double bonding section is formed by ball bonding.

9. The semiconductor device according to claim 1, wherein the wire used in the semiconductor device contains at least one of gold, aluminum, copper, platinum, palladium, silver, a gold alloy, an aluminum alloy, a copper alloy, a platinum alloy, a palladium alloy and a silver alloy.

10. The semiconductor device according to claim 1, wherein a top of the second wire is lower than a top of the first wire.

11. The semiconductor device according to claim 1, wherein a top of the second wire is lower than a top of the third wire.

12. The semiconductor device according to claim 1, wherein the third wire is entirely sealed with the resin.

13. The semiconductor device according to claim 1, wherein the lead terminal is partially sealed with the resin.

14. The semiconductor device according to claim 1, wherein the lead terminal is bent.

15. The semiconductor device according to claim 1, wherein a first part of the double bonding section is formed on the second bonding section, and a second part of the double bonding section is formed on a region other than the second bonding section.

16. A semiconductor device, sealed with resin, in which a semiconductor chip is die-bonded to a surface of an island, a first end of a first wire is wire-bonded to an electrode formed on a surface of the semiconductor chip to form a first bonding section, and a second end of the first wire is wire-bonded directly to the island to form a second bonding section, wherein
the island is made of an electrical conductor,
the second bonding section having an extended portion formed by the second end of the first wire pressed directly on the island,
a double bonding section formed by wire-bonding a second wire is provided on the second bonding section of the first wire wire-bonded directly onto the island, a first end of the second wire being connected onto the second bonding section to form a third bonding section, a second end of the second wire being connected to the surface of the island to form a fourth bonding section, the first end of the second wire being in direct contact with the first wire on the extended portion to form the double bonding section,
the semiconductor device comprises a fifth bonding section formed by connecting a first end of a third wire to the surface of the semiconductor chip, and a sixth bonding section formed by connecting a second end of the third wire to a surface of a lead terminal,
the semiconductor chip, the island, the first wire, the second wire and the third wire are sealed with the resin, and
a length of the second wire between the third bonding section and the fourth bonding section is shorter than a length of the third wire between the fifth bonding section and the sixth bonding section in a side view,
wherein the second end of the first wire and the second end of the second wire are directly attached to the island, the first end of the first wire and the first end of the second wire are indirectly attached to the island, and a difference in height between the first end of the first wire and the first end of the second wire is the same as a thickness of the semiconductor chip,
wherein the second bonding section is formed as a result of transformation of the first wire.

17. The semiconductor device according to claim 16, wherein the resin contains a main resin component and a curing component.

18. The semiconductor device according to claim 17, wherein the main resin component contains thermoplastic resin.

19. The semiconductor device according to claim 17, wherein the main resin component contains thermosetting resin.

20. The semiconductor device according to claim 17, wherein the main resin component contains at least one of epoxy resin, polyphenylene sulfide resin and polyphenylene ether resin.

21. The semiconductor device according to claim 17, wherein the curing component contains phenol resin, and the resin further contains an inorganic filler.

22. The semiconductor device according to claim 21, wherein the inorganic filler contains at least one of quartz glass, crystalline silica and molten silica.

23. The semiconductor device according to claim 16, wherein the double bonding section is formed by ball bonding.

24. The semiconductor device according to claim 16, wherein the wire used in the semiconductor device contains at least one of gold, aluminum, copper, platinum, palladium, silver, a gold alloy, an aluminum alloy, a copper alloy, a platinum alloy, a palladium alloy and a silver alloy.

25. The semiconductor device according to claim 16, wherein a top of the second wire is lower than a top of the first wire.

26. The semiconductor device according to claim 16, wherein a top of the second wire is lower than a top of the third wire.

27. The semiconductor device according to claim 16, wherein the lead terminal is electrically connected with the semiconductor chip through the third wire, and the lead terminal is partially sealed with the resin.

28. The semiconductor device according to claim 16, wherein the lead terminal is electrically connected with the semiconductor chip through the third wire, and the lead terminal is bent.

29. The semiconductor device according to claim 16, wherein a first part of the double bonding section is formed on the second bonding section, and a second part of the double bonding section is formed on a region other than the second bonding section.

30. A semiconductor device, sealed with resin, in which a semiconductor chip is die-bonded to a surface of an island, a first end of a first wire is wire-bonded to a surface of the semiconductor chip to form a first bonding section, and a second end of the first wire is wire-bonded directly to the island to form a second bonding section, wherein
the island is made of an electrical conductor,
the second bonding section having an extended portion formed by the second end of the first wire pressed directly on the island,
the semiconductor chip and the island are sealed with the resin,
a double bonding section formed by wire-bonding a second wire is provided on the second bonding section of the first wire wire-bonded directly onto the island,
a first end of the second wire being connected onto the second bonding section, and a second end of the second wire being connected to the surface of the island, the first end of the second wire being in direct contact with the first wire on the extended portion to form the double bonding section,
wherein the second end of the first wire and the second end of the second wire are directly attached to the island, the first end of the first wire and the first end of the second wire are indirectly attached to the island, and a difference in height between the first end of the first wire and the first end of the second wire is the same as a thickness of the semiconductor chip,
wherein the second bonding section is formed as a result of transformation of the first wire.

31. A semiconductor device, sealed with resin, in which a semiconductor chip is die-bonded to a surface of an island, a first end of a first wire is wire-bonded to a surface of the semiconductor chip to form a first bonding section, and a second end of the first wire is wire-bonded directly to the island to form a second bonding section, wherein
the island is made of an electrical conductor,
the second bonding section having an extended portion formed by the second end of the first wire pressed directly on the island, a double bonding section formed by wire-bonding a second wire is provided on the second bonding section of the first wire wire-bonded directly onto the island, a first end of the second wire being connected onto the second bonding section to form a third bonding section, a second end of the second wire being connected to the surface of the island to form a fourth bonding section, the first end of the second wire being in direct contact with the first wire on the extended portion to form the double bonding section, the semiconductor device comprises a fifth bonding section formed by connecting a first end of a third wire to the surface of the semiconductor chip, and a sixth bonding section formed by connecting a second end of the third wire to a surface of a lead terminal, the semiconductor chip, the island, the first wire, the second wire and the third wire are sealed with the resin, and a length of the second wire between the third bonding section and the fourth bonding section is shorter than a length of the third wire between the fifth bonding section and the sixth bonding section in a side view, wherein the second end of the first wire and the second end of the second wire are directly attached to the island, the first end of the first wire and the first end of the second wire are indirectly attached to the island, and a difference in height between the first end of the first wire and the first end of the second wire is the same as a thickness of the semiconductor chip, wherein the second bonding section is formed as a result of transformation of the first wire.

32. The semiconductor device according to claim 31, wherein the resin contains a main resin component and a curing component.

33. The semiconductor device according to claim 32, wherein the main resin component contains thermoplastic resin.

34. The semiconductor device according to claim 32, wherein the main resin component contains thermosetting resin.

35. The semiconductor device according to claim 32, wherein the main resin component contains at least one of epoxy resin, polyphenylene sulfide resin and polyphenylene ether resin.

36. The semiconductor device according to claim 32, wherein the curing component contains phenol resin, and the resin further contains an inorganic filler.

37. The semiconductor device according to claim 36, wherein the inorganic filler contains at least one of quartz glass, crystalline silica and molten silica.

38. The semiconductor device according to claim 31, wherein the double bonding section is formed by ball bonding.

39. The semiconductor device according to claim 31, wherein the wire used in the semiconductor device contains at least one of gold, aluminum, copper, platinum, palladium, silver, a gold alloy, an aluminum alloy, a copper alloy, a platinum alloy, a palladium alloy and a silver alloy.

40. The semiconductor device according to claim 31, wherein a top of the second wire is lower than a top of the first wire.

41. The semiconductor device according to claim 31, wherein a top of the second wire is lower than a top of the third wire.

42. The semiconductor device according to claim 31, wherein the lead terminal is electrically connected with the semiconductor chip through the third wire, and the lead terminal is partially sealed with the resin.

43. The semiconductor device according to claim 31, wherein the lead terminal is electrically connected with the semiconductor chip through the third wire, and the lead terminal is bent.

44. The semiconductor device according to claim 31, wherein a first part of the double bonding section is formed on the second bonding section, and a second part of the double bonding section is formed on a region other than the second bonding section.

45. A semiconductor device, comprising:
a semiconductor chip;
an island on which the semiconductor chip is mounted;
a first bonding section formed by connecting a first end of a first wire to a first electrode formed on a surface of the semiconductor chip;
a second bonding section formed by connecting a second end of the first wire directly to a surface of the island, the second bonding section having an extended portion formed by the second end of the first wire pressed directly on the island;
a third bonding section formed by connecting a first end of a second wire onto the second bonding section of the first wire, the first end of the second wire being in direct contact with the first wire on the extended portion to form the double bonding section;
a fourth bonding section formed by connecting a second end of the second wire to the surface of the island;
a fifth bonding section formed by connecting a first end of a third wire to a second electrode formed on the surface of the semiconductor chip;
a sixth bonding section formed by connecting a second end of the third wire to a surface of a lead terminal; and
a resin sealing the semiconductor chip, the island, the first wire, the second wire and the third wire, wherein
the island is made of an electrical conductor, and
a length of the second wire between the third bonding section and the fourth bonding section is shorter than a length of the third wire between the fifth bonding section and the sixth bonding section in a side view,
wherein the second end of the first wire and the second end of the second wire are directly attached to the island, the first end of the first wire and the first end of the second wire are indirectly attached to the island, and a difference in height between the first end of the first wire and the first end of the second wire is the same as a thickness of the semiconductor chip,
wherein the second bonding section is formed as a result of transformation of the first wire.

46. The semiconductor device according to claim 45, wherein the resin contains a main resin component and a curing component.

47. The semiconductor device according to claim 46, wherein the main resin component contains thermoplastic resin.

48. The semiconductor device according to claim 46, wherein the main resin component contains thermosetting resin.

49. The semiconductor device according to claim 46, wherein the main resin component contains at least one of epoxy resin, polyphenylene sulfide resin and polyphenylene ether resin.

50. The semiconductor device according to claim 46, wherein the curing component contains phenol resin, and the resin further contains an inorganic filler.

51. The semiconductor device according to claim 50, wherein the inorganic filler contains at least one of quartz glass, crystalline silica and molten silica.

52. The semiconductor device according to claim 45, wherein the double bonding section is formed by ball bonding.

53. The semiconductor device according to claim 45, wherein the wire used in the semiconductor device contains at least one of gold, aluminum, copper, platinum, palladium, silver, a gold alloy, an aluminum alloy, a copper alloy, a platinum alloy, a palladium alloy and a silver alloy.

54. The semiconductor device according to claim 45, wherein a top of the second wire is lower than a top of the first wire.

55. The semiconductor device according to claim 45, wherein a top of the second wire is lower than a top of the third wire.

56. The semiconductor device according to claim 45, wherein the lead terminal is partially sealed with the resin.

57. The semiconductor device according to claim 45, wherein the lead terminal is bent.

58. The semiconductor device according to claim 45, wherein a first part of the double bonding section is formed on the second bonding section, and a second part of the double bonding section is formed on a region other than the second bonding section.

59. A semiconductor device, comprising:
   a semiconductor chip;
   an island on which the semiconductor chip is mounted;
   a first bonding section formed by connecting a first end of a first wire to a surface of the semiconductor chip;
   a second bonding section formed by connecting a second end of the first wire directly to a surface of the island, the second bonding section having an extended portion formed by the second end of the first wire pressed directly on the island;
   a third bonding section formed by connecting a first end of a second wire onto the second bonding section of the first wire, the first end of the second wire being in direct contact with the first wire on the extended portion;
   a fourth bonding section formed by connecting a second end of the second wire to the surface of the island;
   a fifth bonding section formed by connecting a first end of a third wire to the surface of the semiconductor chip;
   a sixth bonding section formed by connecting a second end of the third wire to a surface of a lead terminal; and
   a resin sealing the semiconductor chip, the island, the first wire, the second wire and the third wire, wherein
   the island is made of an electrical conductor, and
   a length of the second wire between the third bonding section and the fourth bonding section is shorter than a length of the third wire between the fifth bonding section and the sixth bonding section in a side view,
   wherein the second end of the first wire and the second end of the second wire are directly attached to the island, the first end of the first wire and the first end of the second wire are indirectly attached to the island, and a difference in height between the first end of the first wire and the first end of the second wire is the same as a thickness of the semiconductor chip,
   wherein the second bonding section is formed as a result of transformation of the first wire.

* * * * *